United States Patent
Hansson et al.

(10) Patent No.: US 10,860,495 B2
(45) Date of Patent: Dec. 8, 2020

(54) STORAGE CIRCUITRY RESPONSIVE TO A TAG-MATCHING COMMAND

(71) Applicant: ARM LIMITED, Cambridge (GB)

(72) Inventors: Andreas Hansson, Cambridge (GB); Nikos Nikoleris, Cambridge (GB); Wendy Arnott Elsasser, Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 16/464,019

(22) PCT Filed: Sep. 15, 2017

(86) PCT No.: PCT/GB2017/052732
§ 371 (c)(1),
(2) Date: May 24, 2019

(87) PCT Pub. No.: WO2018/100331
PCT Pub. Date: Jun. 7, 2018

(65) Prior Publication Data
US 2019/0384718 A1     Dec. 19, 2019

(30) Foreign Application Priority Data
Nov. 29, 2016   (GR) .............................. 20160100608

(51) Int. Cl.
*G06F 12/08*     (2016.01)
*G06F 12/10*     (2016.01)
*G06F 12/0895*   (2016.01)
*G06F 12/0864*   (2016.01)
(Continued)

(52) U.S. Cl.
CPC ...... *G06F 12/0895* (2013.01); *G06F 12/0864* (2013.01); *G11C 11/1673* (2013.01); *G11C 11/1675* (2013.01); *G11C 11/40622* (2013.01)

(58) Field of Classification Search
CPC combination set(s) only.
See application file for complete search history.

(56) References Cited

U.S. PATENT DOCUMENTS

| 6,697,909 B1 | 2/2004 | Wang et al. |
| 2003/0046510 A1 | 3/2003 | North |
| 2010/0027329 A1 | 2/2010 | Lee et al. |

(Continued)

OTHER PUBLICATIONS

International Search Report for PCT/GB2017/052732, dated Nov. 16, 2017, 3 pages.

(Continued)

*Primary Examiner* — Yong J Choe
(74) *Attorney, Agent, or Firm* — Nixon & Vanderhye P.C.

(57) ABSTRACT

Storage circuitry comprises an array of storage locations arranged in rows and columns, a row buffer comprising a plurality of entries each to store information from a storage location at a corresponding column of an active row of the array, and comparison circuitry responsive to a tag-matching command specifying a tag value to compare the tag value with information stored in each of a subset of two or more entries of the row buffer. The comparison circuitry identifies which of the subset of entries, if any, is a matching entry storing information matching the tag value. This allows memory technologies such as DRAM to be used more efficiently as a set-associative cache.

20 Claims, 7 Drawing Sheets

(51) Int. Cl.
*G11C 11/16* (2006.01)
*G11C 11/406* (2006.01)

(56) References Cited

U.S. PATENT DOCUMENTS

| | | |
|---|---|---|
| 2010/0180083 A1 | 7/2010 | Lee et al. |
| 2011/0307664 A1 | 12/2011 | Paver et al. |
| 2013/0007358 A1 | 1/2013 | Hu et al. |
| 2013/0138892 A1 | 5/2013 | Loh et al. |
| 2013/0212585 A1 | 8/2013 | Tran |
| 2013/0246696 A1 | 9/2013 | Woodward |
| 2013/0304991 A1 | 11/2013 | Böttcher et al. |
| 2015/0220436 A1* | 8/2015 | Cooray ............... G06F 12/1045 711/122 |
| 2016/0188429 A1 | 6/2016 | Noguchi et al. |

OTHER PUBLICATIONS

Office Action dated Apr. 8, 2020 for EP Application No. 17771846.7, 5 pages.

* cited by examiner

STORAGE CIRCUITRY RESPONSIVE TO A TAG-MATCHING COMMAND

This application is the U.S. national phase of International Application No. PCT/GB2017/052732 filed 15 Sep. 2017, which designated the U.S. and claims priority to GR Patent Application No. 20160100608 filed 29 Nov. 2016, the entire contents of each of which are hereby incorporated by reference.

The present technique relates to the field of storage circuitry.

A variety of technologies are available for implementing storage circuitry for data processing systems, including for example SRAM (static random access memory), DRAM (dynamic random access memory), PRAM (phase-change random access memory), MRAM (magnetoresistive random access memory), etc. Some types of memory technology, such as DRAM, provide an array of storage locations which are organised in rows and columns, and access to a given storage location requires a particular row of the array to be activated and the data from each location in that row to be transferred to a row buffer. Once a row is activated, a number of reads/writes to different locations in the row can be performed by reading or updating the contents of the row buffer. Any updates to the row buffer can be propagated to the corresponding storage locations in the array, and when the row is no longer required, the row can be closed using a precharge command.

At least some examples provide storage circuitry comprising:

an array of storage locations arranged in rows and columns;

a row buffer comprising a plurality of entries each to store information from a storage location at a corresponding column of an active row of the array; and comparison circuitry responsive to a tag-matching command specifying a tag value to compare the tag value with information stored in each of a subset of entries of the row buffer, and to identify which of said subset of entries, if any, is a matching entry storing information matching the tag value, said subset comprising two or more entries of the row buffer.

At least some examples provide an apparatus comprising:

the storage circuitry described above; and a cache controller to control accesses to cached data stored in the storage circuitry.

At least some examples provide storage circuitry comprising:

an array of means for storing information arranged in rows and columns;

means for buffering information from an active row of the array, the means for buffering comprising a plurality of entries each to store information from a means for storing at a corresponding column of an active row of the array; and means for comparing, in response to a tag-matching command specifying a tag value, the tag value with information stored in each of a subset of entries of the means for buffering, and identifying which of said subset of entries, if any, is a matching entry storing information matching the tag value, said subset comprising two or more entries of the means for buffering.

At least some examples provide a method for accessing information from storage circuitry comprising an array of storage locations arranged in rows and columns; the method comprising;

transferring information from storage locations in an active row of the array to a row buffer comprising a plurality of entries, each entry storing information from a storage location at a corresponding column of the active row; and in response to a tag-matching command specifying a tag value, comparing the tag value with information stored in each of a subset of entries of the row buffer, and identifying which of said subset of entries, if any, is a matching entry storing information matching the tag value, said subset comprising two or more entries of the row buffer.

Further aspects, features and advantages of the present technique will be apparent from the following description of examples, which is to be read in conjunction with the accompanying drawings, in which.

Storage circuitry may have a row buffer to temporarily store information from an active row of storage locations during reads or writes to that row. The row buffer includes a number of entries, each entry for storing the information from a storage location at a corresponding column of the active row. The storage circuitry may be provided with comparison circuitry which is responsive to a tag-matching command specifying a tag value to compare the tag value with information stored in each of a subset of entries of the row buffer (the subset comprising at least two entries), and to identify which of said subset of entries, if any, is a matching entry storing information matching the tag value. This allows tag lookup operations to be performed faster as multiple tags can be compared directly in the row buffer rather than requiring each entry to be individually read out to an external circuit for comparison against the tag value. This means the storage circuitry can be used more effectively as a set-associative cache, since a set of locations can have their tags looked up in response to a single tag-matching command, rather than requiring a number of separate read operations. This is useful as storage technologies using a row buffer can be more area-efficient for a given amount of storage capacity than alternative storage technologies, so enabling more efficient use of this type of storage circuitry as a set-associative cache can enable larger caches to be produced with less manufacturing cost.

The comparison circuitry may perform a plurality of comparisons in parallel, each comparison comparing the tag value with the information in a corresponding one of said subset of entries of the row buffer. Hence, tag lookups of multiple entries can be faster compared to sequentially reading each tag out individually for comparing against a target tag value.

In some cases, the comparison circuitry may compare the tag value associated with the tag-matching command against the entire contents of each entry in the subset of entries of the row buffer. When the storage circuitry is used as a cache, the storage locations may be allocated in pairs with each pair comprising one location for storing a cached data value and another storage location for storing a corresponding tag value, so the subset of entries of the row buffer may be those entries which store tag values rather than data values. In general, the tag value may identify part of the address of the data value in the other location of the pair. However, the tag value could also identify other control information for controlling caching of the data, e.g. coherency status information indicating whether the corresponding data value is clean or dirty, or eviction control information for controlling eviction of data from the cache (e.g. a least recently used (LRU) count or other information for tracking recent access patterns to stored data). Therefore, in some embodiments the comparison circuitry may compare the tag value specified by the tag-matching command against only a portion of the information stored in each entry of the subset of entries of the row buffer.

A configuration storage element may be provided to store configuration information identifying which entries of the row buffer are within the subset of entries to be compared using the comparison circuitry. This enables the physical storage capacity of the storage circuitry to be allocated in different configurations for storing the tag values and data values when the storage circuitry is being used as a cache, since the comparison circuitry may determine from the configuration storage element which entries in the row buffer are intended to store tag values rather than data values. For example, the configuration information could specify control information such as the desired associativity, cache line size, or tag size being used by the cache, from which the subset of entries could be determined by the comparison circuitry. Alternatively, the configuration information may explicitly identify which entries of the row buffer are to be compared against the tag value (e.g. using a bitmap with each bit identifying whether or not a corresponding entry should be considered part of the subset of entries).

When one of said subset of entries is identified as the matching entry in response to the tag-matching command (a "hit condition"), a read or write operation may be triggered for reading or writing information corresponding to a target storage location selected in dependence on which entry of the row buffer is the matching entry. For example, the target storage location may be the paired storage location that stores the data value associated with the tag value stored in the storage location for which the hit was detected. For a read operation, the information read from the target storage location can be returned as a response to the tag-matching command.

In some cases, the target storage location may be another storage location in the same row of the array as the storage location corresponding to said matching entry of the row buffer. With this approach, each tag-data pair can be allocated within the same row of the storage circuitry, which can make control of the read operation less complex.

Alternatively, the target storage location could be in a different row to the storage location for which the match was detected. Although it is possible to provide storage circuitry comprising a single bank of storage locations, in many cases two or more banks of storage locations may be provided, each bank comprising an array of storage locations arranged in rows and columns, a row buffer and comparison circuitry as discussed above. In practice, following a read from an active row in one bank, it can often be faster to read information from a different bank than to perform another read in the same row of the first bank. Therefore, to improve performance in a multi-bank embodiment, when allocating a data-tag pair to the storage circuitry, it can be useful to write the data value to a storage location in one bank and the corresponding tag value to a storage location in a different bank. Hence, on processing a tag-matching command, when the hit condition is identified, the target storage location to which the read operation is triggered may be in a different bank to the storage location corresponding to the matching entry of the row buffer.

In some examples, when the hit condition is identified, the comparison circuitry may store an indication of which entry of the row buffer is said matching entry to a predetermined storage element. The storage circuitry may have control circuitry supporting a write-to-previous-hit command, which triggers a write operation to write information to the storage location associated with the entry of the row buffer identified by said predetermined storage element. Often after reading a data value from a cache it can be desirable to update part of the corresponding tag value (e.g. to update the coherency status or eviction control information mentioned above). Hence, by recording the matching entry in the predetermined storage element, the subsequent tag write can be performed without a cache controller or other external controller needing to know the exact location of the tag or repeat the tag lookup operation.

Alternatively, the updating of status information, such as coherency status information or cache replacement policy information, could be performed in response to the tag-matching command itself. Hence, when there is a hit condition and a matching entry is identified in response to the tag-matching command, control circuitry may update status information in a storage location selected based on which entry of the row buffer is the matching entry. Typically the selected storage location can be the location in the storage array that corresponds to the matching entry itself, but it could also correspond to another entry of the same active row. By updating cache status information on a cache hit in response to the tag-matching command, this avoids the need for a separate write command to be provided from the cache controller to the storage circuitry for updating the status information.

In response to the tag-matching command, if none of the subset of entries of the row buffer stores information matching the tag value (a "miss condition"), the comparison circuitry may return a miss indication. This can be output to a cache controller to indicate that the required data is not currently stored in the cache. In some cases the miss indication could be an explicit signal indicating whether there was a hit or miss. However, this could require an additional output pin to be provided for communicating the hit/miss signal to other circuits.

However, in some cases the data stored in the storage circuitry may be protected against errors by using error detecting codes. Some types of error detecting codes could merely allow errors (such as bit flips caused by a particle strike or other single event upset) to be detected, but not corrected. E.g. parity codes or checksums could be used to identify when a bit flip has occurred, but not which bit is the erroneous bit. Alternatively, the error detecting codes could be error correcting codes which also allow an error to be corrected by providing some redundant information which can be used to identify the correct data value. The error correcting codes could be convolution codes or block codes for example. The error detecting code could be a separate value from the corresponding data value, or alternatively the data could be encoded to provide a single data value from which both the original data value and the information identifying whether there is an error can be determined.

In examples using error detecting codes, when a miss is identified in response to the tag-matching command, the miss indication may comprise a predetermined pattern of information associated with an invalid error detecting code. Although the invalid error detecting code would normally indicate that an error has arisen in the corresponding data, a cache controller or other circuit receiving the miss indication may be configured such that, when the data has the predetermined pattern, then the invalid error detecting code is interpreted not as indicating an error, but as indicating that the tag lookup identified a miss. This allows the miss condition to be signalled using the data channel used for read operations, to avoid needing to provide an additional pin for communicating a separate hit/miss signal.

The control circuitry of the storage circuitry may also be responsive to a victim read command to read data from a victim entry of the row buffer selected in dependence on cache replacement policy information stored in the row buffer, and to invalidate data from a storage location associated with said victim entry. On a cache miss, if there are no invalid locations in the relevant set, then it may be required to find a victim block to evict data from and replace it with the new data which will be fetched from memory. Identifying which entry to select as the victim entry may require reading of cache replacement policy information from the relevant set (e.g. information indicating which entry was least recently used). Rather than reading out the replacement policy information to a cache controller and then the cache controller determining which entry to select as the victim entry and issuing a subsequent read, the control circuitry may support analysis of the replacement policy information locally within the storage circuitry itself. For example, if the replacement policy is pseudo-least recently used, the victim read command can control the control circuitry within the storage circuitry to traverse a binary tree to find the least recently used element, return the data of the block so that it can be written back to memory, and invalidate the block. This can save at least one command as both the reading (and processing) of the replacement policy information and the reading of the victim data can be done within the storage circuitry in response to one command.

After an eviction from the victim storage location, a subsequent write command can be issued to the storage circuitry to write the data fetched from memory to the victim storage location. To speed up handling of that write, in response to the victim read command the control circuitry may store an indication of which entry of the row buffer was the victim entry to a predetermined storage element. A write-to-previous-hit command as discussed above can then be used to write the replacement data to the storage location associated with the entry identified by the predetermined storage element. This avoids the need to review the replacement policy information again when writing replacement data to the victim entry.

A tag-gather command can also be implemented, to trigger control circuitry to perform a read operation to read information from each of said subset of entries of the row buffer. Hence, in response to the tag-gather command, the tag information from the active row can be gathered and returned faster than if separate read operations were required to read each tag sequentially. This can be useful for example for allowing a cache controller to make better replacement decisions when allocating new data to a cache. As the data channel between the storage circuitry and cache controller may not be as wide as the total size of all the tag information in the active row, multiple data transfers may be performed sequentially in response to the tag gather command to transfer the tag information in chunks to the cache controller.

The technique discussed above can be used for storage circuitry based on any memory technology which uses a row buffer. However, it can be particularly useful for DRAM-based storage circuitry. DRAM is a relatively area-efficient memory technology, but is typically relatively to slow to access, making it difficult to use effectively as a set-associative cache. Hence, DRAM has traditionally been used for main memory but not for caches. By providing the comparison circuitry described above, DRAM becomes more attractive for use a cache, enabling larger caches to be implemented with less circuit area and hence lower manufacturing cost compared to alternatives such as SRAM.

An apparatus (e.g. a data processing system) may comprise the storage circuitry described above and a cache controller to control accesses to cached data stored in the storage circuitry. In response to a cache access request specifying a target address, one of the cache controller and the storage circuitry may issue the tag-matching command specifying a tag value determined as a function of said target address. In some cases, the generation of the tag-matching command may take place at the cache controller, and the cache controller may then transmit a row address and the tag value to the storage circuitry, which may compare the tag value with the subset of entries of the row buffer, trigger a read/write to the matching entry and then return the required data or miss indication for a read or a write acknowledge signal for a write. Alternatively, the cache controller could issue a memory address to the storage circuitry which may then decode the row address and tag value internally and then process the tag-matching command in a similar way to discussed above. When a hit is identified in response to the tag-matching command, the storage circuitry may output to the cache controller at least one of: a data value corresponding to a target storage location other than the storage location associated with the matching entry, and information for identifying which storage location of the storage circuitry is the target storage location. In practice, performance can be faster if the storage circuitry outputs the data value itself so that there is no need for a subsequent read command in addition to the tag matching command.

Figure 1:
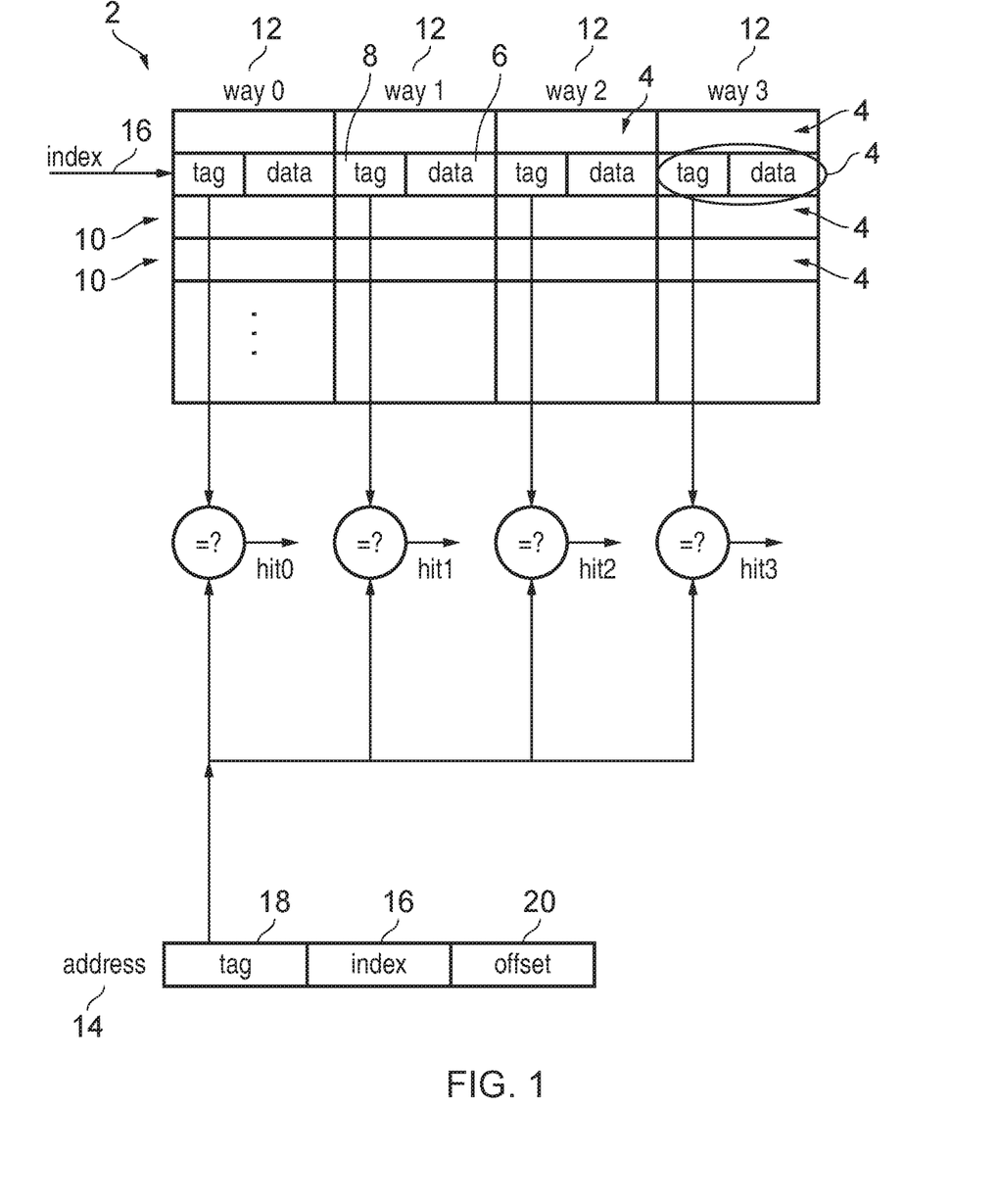
FIG. 1 schematically illustrates an example of the logical functionality of a tag lookup operation for a set-associative cache.

FIG. 1 shows the logical functionality of a tag lookup operation for a set-associative cache 2. The cache 2 has a number of cache entries 4 each comprising a tag-data pair, each pair comprising a data value 6 and a tag value 8 specifying a portion of the memory address corresponding to the data value, and optionally specifying other information such as coherency status information or eviction control information. The cache entries 4 are logically organised in sets 10, each comprising a certain number of cache entries (e.g. FIG. 1 shows a 4-way set associative cache 2, so each set 10 comprises four cache entries 4). The group of locations at corresponding locations within each set is referred to as a "way" 12, e.g. way 0 comprises the first cache entry 4 of each set 10, way 1 comprises the second cache entry 4 of each set 10, etc.

When a read/write operation is performed, the memory address 14 of the required is provided, an index portion 16 of the target address (or a hash of the index portion 16) is used to select which set 10 to access, a tag portion 18 of the target address 14 is compared against the tag values 8 in each of the entries 4 of the indexed set 10. A hit signal is asserted for the way 12 containing the matching tag, and the corresponding data value 6 can be read out from cache entry 4 in the matching way 12 of the indexed set 10. An offset portion 20 of the target address may identify the location of the required data within the returned data value 6.

While FIG. 1 shows the logical functionality desired for a set-associative cache, in the physical hardware implementation, this can be implemented in different ways, depending on the memory technology used for the cache. It is relatively common for SRAM to be used for a cache, as SRAM can be fast to access compared to alternatives such as DRAM. However, increasingly there is a demand for relatively large caches, and SRAM can be relatively circuit area-intensive making it expensive to build larger caches out of SRAM.

Figure 2:
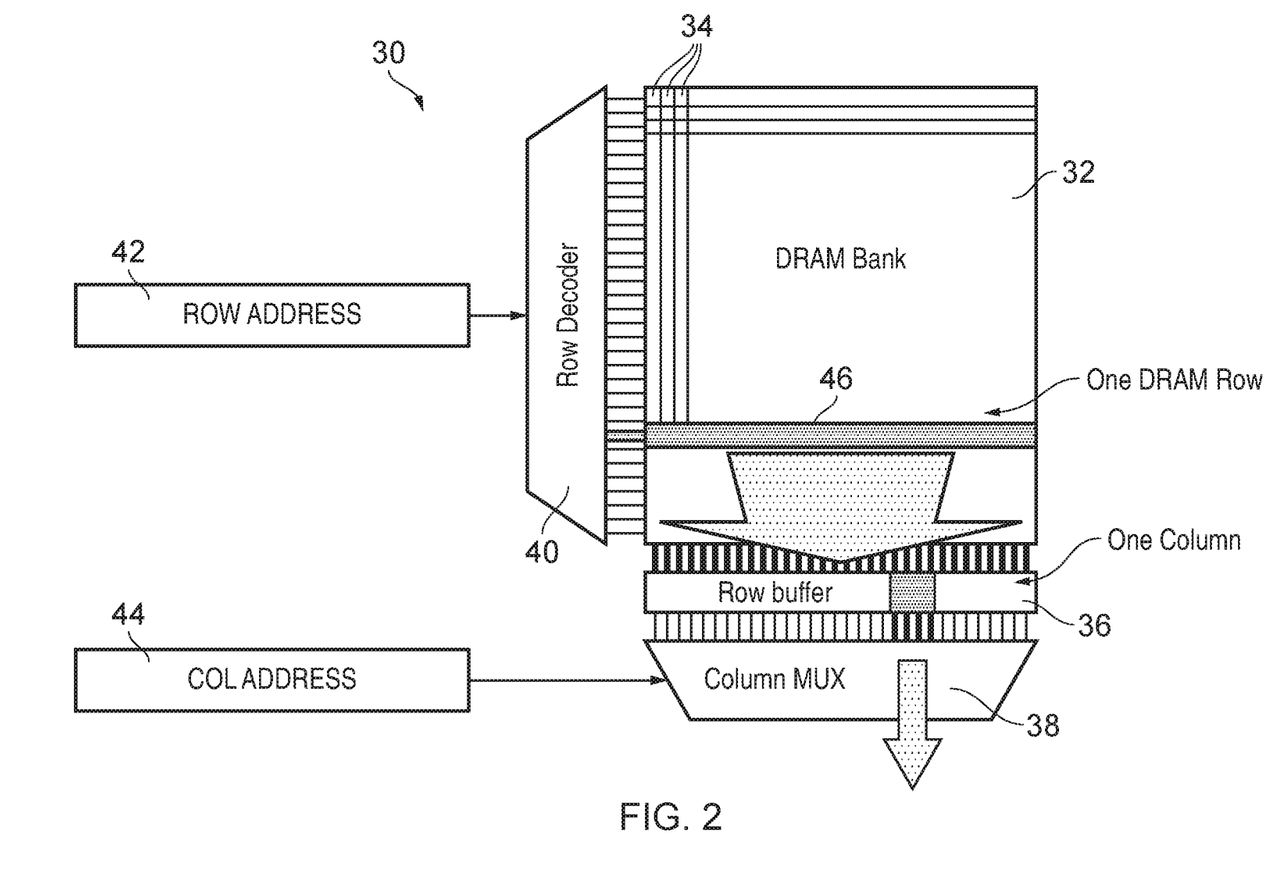
FIG. 2 schematically illustrates an example of a DRAM-based storage array.

DRAM can provide a cheaper technology for use in larger storage structures. FIG. 2 shows an example of a DRAM-based storage circuit 30. The storage circuit 30 comprises an array 32 of storage locations 34 arranged in rows and columns, a row buffer 36, a column multiplexer 38 and a row decoder 40. For DRAM, each storage location 34 comprises a group of bitcells, each bitcell comprising a capacitor which can be selectively charged or discharged to represent a 1 or 0 corresponding to one bit of the overall value represented by the corresponding storage location 34. Accesses to the DRAM 30 are carried out in two stages. First, an activation command specifying a row address 42 is issued. The row decoder 40 activates the corresponding row 46, to bring the information stored in each of the storage locations 34 of the corresponding row into the row buffer 36. Second, a column address 44 accompanies the actual read/write command, which controls the column multiplexer 38 to select an entry of the row buffer 36 corresponding to the specified column within the active row, and either output the information read from that entry as read data or update the data in that entry based on write data provided with the write command. For a write, as the connection between the sense amplifiers forming the row buffer 36 and the corresponding DRAM storage location 34 may be left open, writes to the row buffer 36 may be propagated back to the corresponding storage location 34 as well. Multiple read/write operations may be performed within the same active row, before the row is closed using a precharge command which closes the connection between the row buffer 36 and the active row 46, ensures that the storage locations of the active row 46 have been updated to reflect any writes to the row buffer 36, and resets the row buffer 36 ready for another row to be selected as the active row.

DRAM 30 is often used as the main memory in a processing system, as it can provide relatively large storage capacity at low cost, and for main memory the relatively slow access latency of DRAM 30 is not a problem as main memory is intended for bulk backup storage rather than for storing data for quick access.

Figure 3:
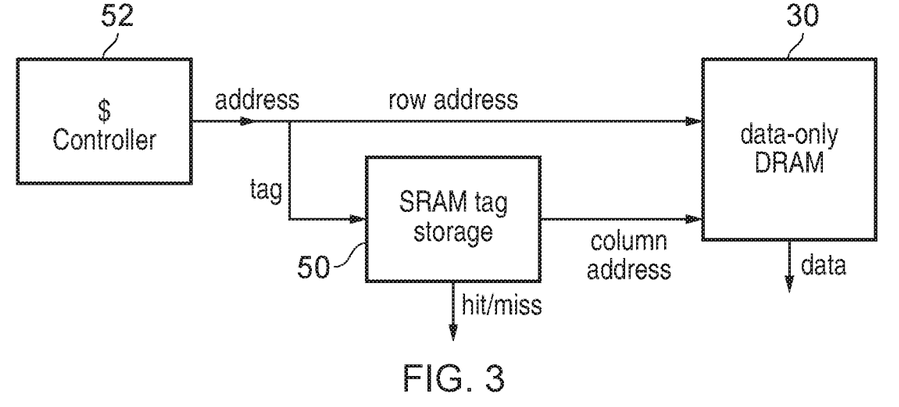
FIGS. 3 and 4 show two alternative approaches for a cache controller to locate target data in a cache implemented using DRAM.
Figure 4:
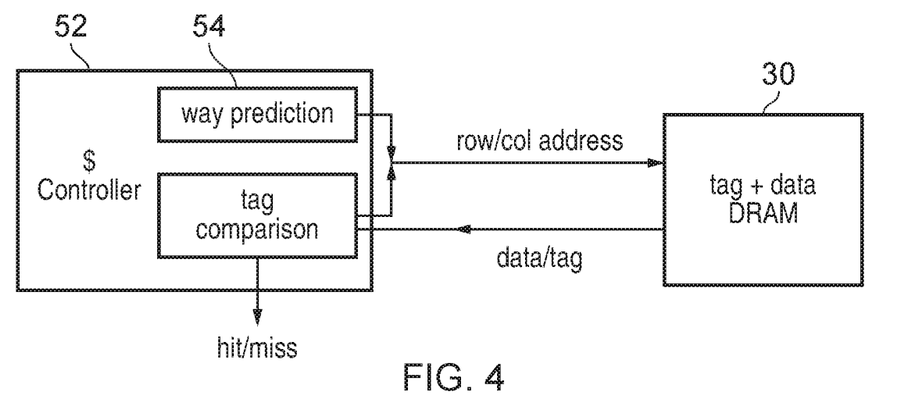

However, increasingly there is a demand for larger cache memories than would be economical to build out of SRAM. DRAM would be attractive for cost saving, but there are some performance issues associated with using DRAM as a cache. In particular, for caches to provide an appropriate balance between performance and area efficiency, it is often desirable to implement the cache as a set-associative cache as explained in FIG. 1. However, the tag lookup for set-associative cache can be difficult to implement using DRAM-based storage technologies. FIGS. 3 and 4 illustrate two alternative ways in which DRAM could be used to implement a set-associative cache.

As shown in FIG. 3, one approach is to store the data value from each tag-data pair in the DRAM 30, but to store the tag values in a separate SRAM-based storage structure 50. Hence, on accessing the cache to obtain data for a given address, a cache controller 52 outputs the tag portion of the address to the SRAM tag storage 50 which compares the tag value against the stored tags of the corresponding set, identifies whether there is a hit or miss, and on a hit provides a column address to the DRAM 30 identifying the target DRAM location corresponding to the matching tag. Meanwhile the row address of the target DRAM location is provided by the cache controller 52. Hence, the DRAM 30 can use the row address and column address to identify the required storage location and return the required data. For writes a similar lookup of the SRAM tag storage 50 may be performed, but this time write data provided by the cache controller 52 is written to the storage location identified by the row address and the column address. A problem with this approach is that the SRAM used for the tag storage 50 is expensive in terms of circuit area, which is particularly a problem as cache capacity gets larger.

FIG. 4 shows an alternative approach where both the data and the tag of each tag-data pair are stored in the DRAM 30 itself, avoiding any need for additional SRAM-based tag storage and hence reducing circuit area. However, with this approach, tag lookups require the cache controller to select a particular way of the set being looked up, issue a read operation specifying the row and column address of the DRAM storage location storing the tag value of that way, read out the tag value, and compare the read tag with the tag portion of the target address to determine whether there is a hit or miss. If there is a hit, a subsequent read access can then specify the row/column address of the corresponding data value for the matching tag, and then the data is returned. If there is a miss, another read access has to be issued to access the next tag of the indexed set, when the same process as for the first tag comparison is repeated for the next tag, and so on until either a matching tag is identified or a miss is identified for all the tags in the indexed set. Way prediction 54 can be provided to track which ways were previously accessed and increase the likelihood that the correct way is selected first time. However, the way prediction hardware 54 incurs an area and power consumption cost, and even if the way prediction is relatively accurate, there are still times when multiple sequential tag read accesses are required, performed back to back, followed by the subsequent data read access which is also sequential to the previous tag lookup. Hence, at the very least each cache access requires a minimum of two commands to be processed back to back (one tag read, and one read/write command), but sometimes three or more commands may be needed if the first tag read does not match the tag of the target address. Hence, this approach is poor in terms of performance.

Figure 5:
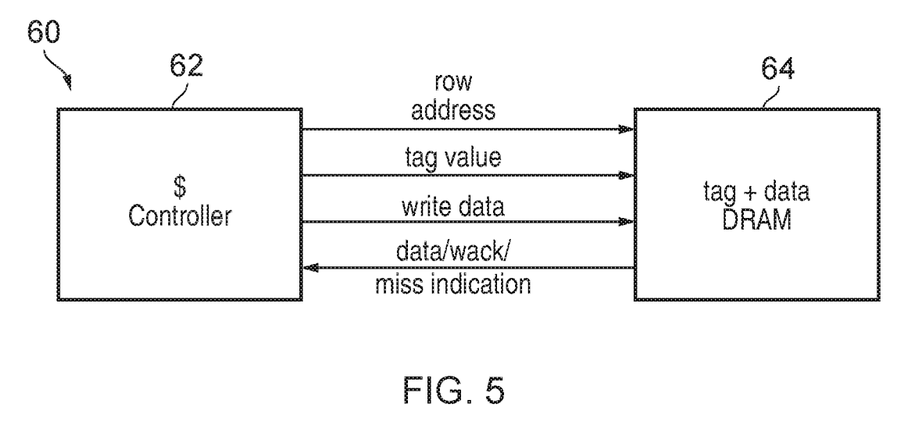
FIG. 5 shows an example in which the DRAM stores both data and its associated tag information, in which the DRAM supports a tag-matching command.

FIG. 5 shows a data processing apparatus 60 comprising a cache controller 62 and DRAM storage circuitry 64 for addressing these issues. As in FIG. 4, both the data and the associated tags are stored in the DRAM 64, so there is no need for separate SRAM-based tag storage 50 as in FIG. 3, saving circuit area. However, the DRAM 64 supports a tag-matching command which enables multiple tags to be compared in parallel within the DRAM 64 in response to a single command issued by the cache controller 62, improving performance. For a read operation, the cache controller 62 issues a tag-matching read command, and provides the DRAM 64 with a row address identifying the required row of DRAM locations and a tag value to be compared with the tags stored in that row of DRAM locations. Both the row address and the tag value can be generated by the cache controller 62 as a function of the target memory address of the data to be accessed. In response to the tag-matching read command, the DRAM 64 compares the tag value against each of the tag values stored within the row identified by the row address, returns the data value corresponding to a matching tag in the event of a hit, and returns a miss indication in the event of a miss. For a write operation, the cache controller 62 issues the row address, tag value and write data, and again the DRAM 64 compares the tag value against each of the tag values stored in the corresponding row, writes the data value to a location corresponding to the matching tag in the event of a hit, allocates the data value and its corresponding tag to a new storage location in the event of a miss, and returns a write acknowledgement to the cache controller 62. This approach provides a better balance between performance and circuit area, and is particularly useful for larger caches where SRAM is not cost-effective.

Figure 6:
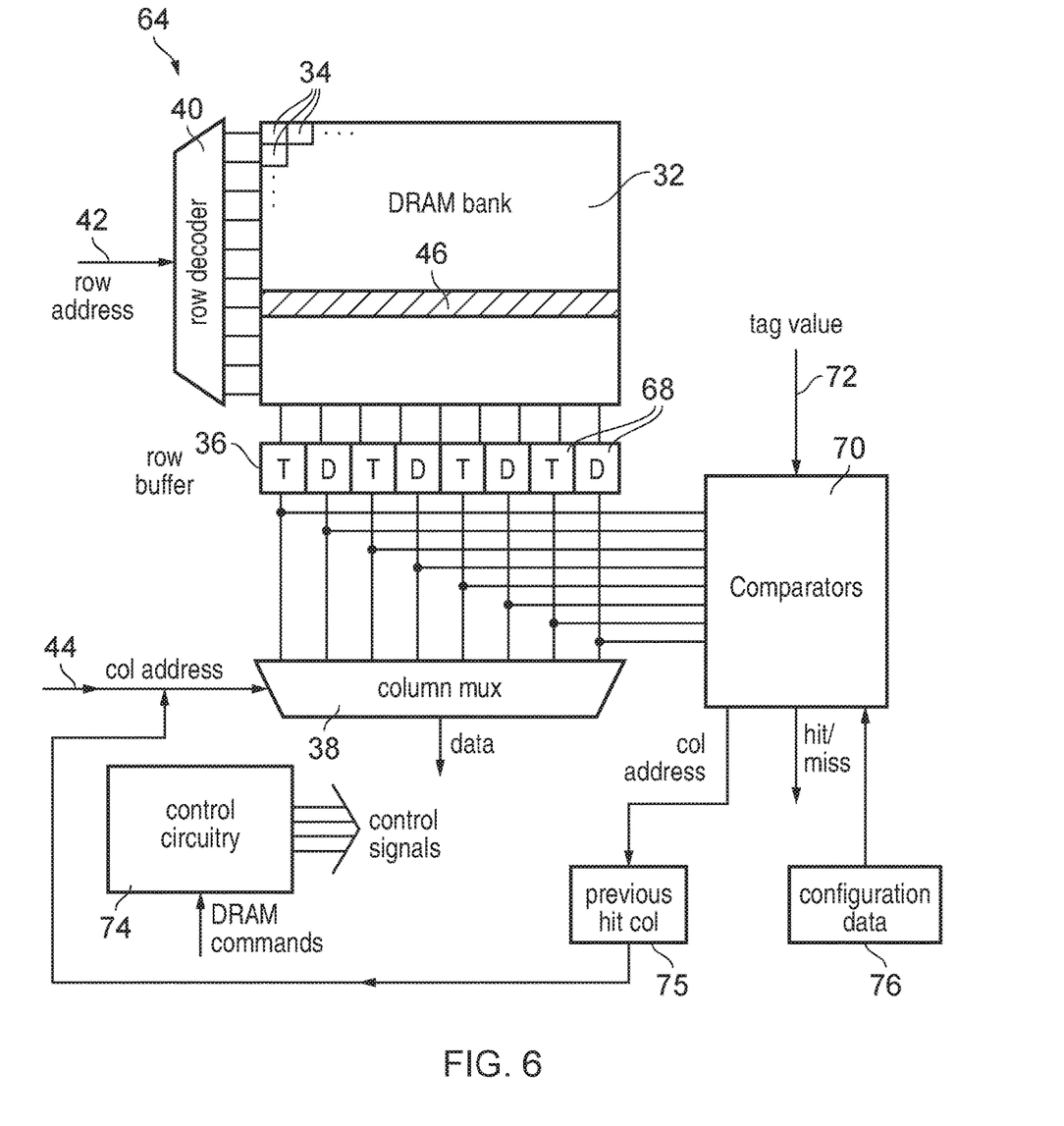
FIG. 6 shows an example of storage circuitry comprising comparison circuitry to compare a tag value against a subset of entries of a row buffer.

FIG. 6 shows the DRAM 64 of FIG. 5 in more detail. As in FIG. 2, the DRAM 64 comprises an array 32 of storage locations 34, row buffer 36, column multiplexer 38 and row decoder 40. The row buffer 36 includes a number of entries 68, each entry 68 corresponding to one column of the storage array 32. Non-tag-matching read and write commands, an activate command and a precharge command are supported in the same way as described for FIG. 2. When an activate command is received, the information stored in each of the storage locations 34 of the row identified by the row address 42 is transferred to the row buffer 36, with each entry 68 being updated with the information from the storage location 34 at a corresponding column of the activated row 46. As indicated in FIG. 6, some of the locations in the active row 46 may store tag values (T) while other locations store data values (D), so the row buffer 68 includes a mix of tags and data.

The DRAM 64 has comparison circuitry 70 for comparing the contents of entries 68 of the row buffer 36 with a tag value 72 supplied from the cache controller 62 with a tag-matching command. The tag-matching command could be a tag-matching read command triggering a tag lookup and associated read, or a tag-matching write command triggering a tag lookup and associated write. Control circuitry 74 is provided to receive commands provided by the cache controller 62 and activate the appropriate control paths in the hardware of the DRAM unit 64 to control the row decoder 40, column multiplexer 38 and comparators 70 to perform the required operations.

Hence, when a tag-matching command is received, the control circuitry 74 controls the comparators 70 to compare the received tag value 72 with the tags stored in a subset of entries 68 of the row buffer. The comparisons between the received tag 72 and the tags stored in the row buffer 36 are performed in parallel, so performance is faster than in the case explained in FIG. 4 where tags are compared sequentially. If any of the tags in the row buffer 36 match received tag 72, a hit signal is asserted and this may trigger a read operation to read the corresponding data value from the DRAM array 32 and return the data to the cache controller 62. For example, in the arrangement shown in FIG. 6, the tags and data values are interleaved in pairs and so when a hit is identified for a given tag, the corresponding data value may be read from the neighbouring entry of the row buffer 36. If none of the compared tags match the specified tag value 72, a miss indication is returned to the cache controller 62.

As shown in FIG. 6, the column address of the row buffer entry 68 matching the tag value 72 can be stored to a storage element 75 within the DRAM unit 64. This allows a subsequent command ("write-to-previous-hit" as discussed below for FIG. 13) to update the matching tag without needing to repeat the tag lookup or make the cache controller 62 aware of which tag matched. While shown separately in FIG. 6, the storage element 75 identifying the previously hit tag could also be part of the row buffer 36 itself.

Figure 7:
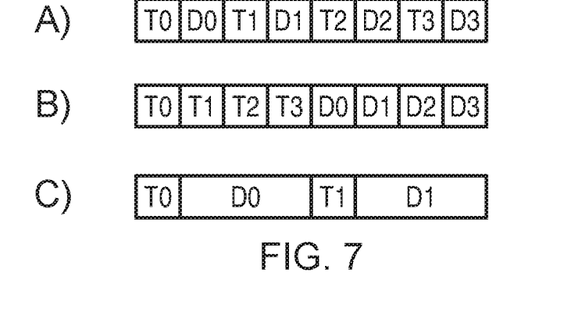
FIG. 7 shows different examples of arranging tags and data within a row of storage cells.

A configuration storage element 76 may be provided to control which particular entries of the row buffer 36 are compared with the tag value 72 by the comparators 70. This allows the same DRAM hardware to be configured in different allocations depending on the cache configuration desired. As shown in parts A) and B) of FIG. 7, the tags and data values can be arranged in different patterns in a given row, with example A) showing the tags and data interleaved as in FIG. 6, while example B) showing all the tags T stored contiguously followed by the corresponding data values D. Hence, the configuration data 76 could identify the entries storing the tags and control the comparators 70 to compare those entries with the tag value 72.

Different users may also wish to use different sized cache lines or different associativity. Hence, the sizes of the data and tag values could vary between different use cases. For example, a 128 MB DRAM part could be configured as a 16-way set-associative cache with 512-byte cache lines and 40-bit tags, and if there is 1 byte of status information then this may require 516 bytes per tag-data pair, and hence roughly 8 kB DRAM rows. However, the same part could be used as an 8-way set-associative cache with 1024 byte cache lines by reconfiguring the configuration data 76 so that the comparators 70 match against a different set of elements. For example, as cache lines become larger, one row may comprise fewer tags as shown in part C) of FIG. 7, and so the comparators 70 may not need to compare the tag value 72 against as many entries of the row buffer 36.

In many cases, it may be most convenient to configure the cache so that one row of storage locations corresponds to one set 10 of the set-associative cache structure. However, this is not essential and in some cases one row of the DRAM array 32 may correspond to multiple sets 10. In this case, part of the row address 42 may be used to select which part of the row buffer 36 is compared against the tag value 72, and the configuration data 76 may identify the particular entries to be considered as the subset of entries within that part of the row buffer 36 (alternatively, part of the row address identifying the set could select between multiple sets of configuration data 76 specifying the different subsets of row buffer entries 68 to be compared for each set within the same DRAM row).

Figure 8:
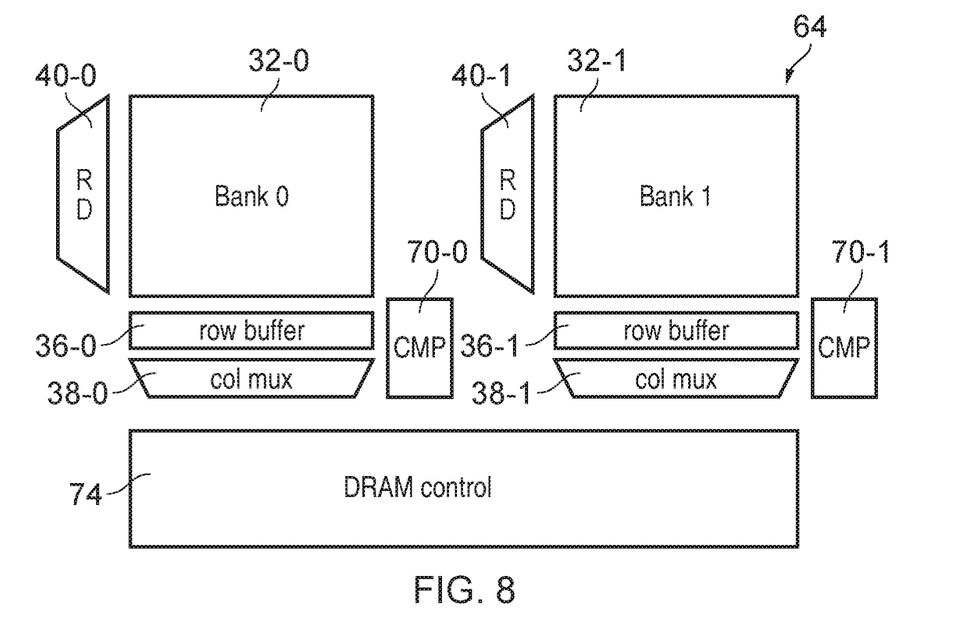
FIG. 8 shows an example of data storage circuitry comprising multiple banks of storage cells.

As shown in FIG. 8, often the DRAM unit 64 may comprise more than one bank of storage locations, each bank comprising a separate instance of a DRAM array 32 of storage locations arranged in rows and columns, a row buffer 36, a column multiplexer 38, a row decoder 40, and the comparison circuitry 70 as discussed above. The control circuitry 74 for processing incoming commands and activating the appropriate signal paths may be shared between the banks. Hence, part of the row address 42 received from the cache controller 62 may select which bank to access. While FIG. 8 shows an example with two banks of DRAM, often there may be more banks, e.g. 4, 8 or 16 banks. Hence, each bank may support tag-matching using the comparison circuitry described above.

Figure 9:
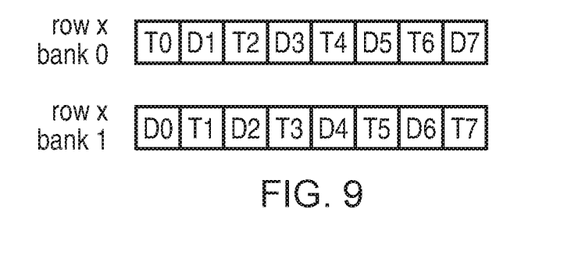
FIG. 9 shows an example where tag-data pairs are split between different banks.

In a multi-bank DRAM implementation, it can be useful to interleave the data values and tag values of a number of tag-data pairs among corresponding rows of separate banks as shown in FIG. 9. For example, for tag-data pair T0-D0, tag value T0 can be stored in row x of bank 0, but its corresponding data value D0 is stored in row x of bank 1. Tag-data pair T1-D1 is similarly split between banks, but this time the tag T1 is stored in bank 1 and the data D1 is stored in bank 0. This is useful because when a row is active and buffered in the sense amplifiers of the row buffer 36, reads and writes to the row buffer 36 may temporarily disturb the values latched in the row buffer 36, so that it takes some time for the contents of the row buffer 36 to settle before another read/write access to the same row can be performed. This means that after performing one read/write to a row in one bank, it can be faster to perform the next read/write access to a different bank than to perform the next access in the same bank as the first read/write operation. By splitting the tag and data values of the same tag-data pair between banks, this allows better performance because the read/write operation for data value D0, say, can be performed faster in bank 1 following the tag access to tag T0 in bank 0. Hence, when a read/write is triggered following a hit, the target storage location may actually be in a different bank.

With the approach shown in FIG. 9, the tag lookup may be divided into two stages, one to search the tags in the indexed set that are stored in the row buffer 36-0 of bank 0, and another to search the tags in the indexed set that are stored in the row buffer 36-1 of bank 1. If the matching tag is identified in bank 0, the second stage is not required and instead a read/write to the entry storing the data for the matching tag can be performed next. If no tag matches in bank 0, a second tag matching step performed using bank 1, and if a hit is identified there then a further read/write operation is triggered for the corresponding data in bank 0. If the tag value 72 also misses in bank 1 then the miss indication is returned. Hence, the timing of returned read data may depend on whether the tag value 72 matches in the first bank or the second bank (alternatively read data returned at the earlier timing could be buffered in the DRAM so that the data is provided to the cache controller 62 at the same timing regardless of which bank the tag hits in). Nevertheless, regardless of whether one or two tag searching operations are required, performance can be improved by enabling a second bank to start a subsequent operation following an operation performed in a first bank without having to first wait for the settling time of the first bank.

Figure 10:
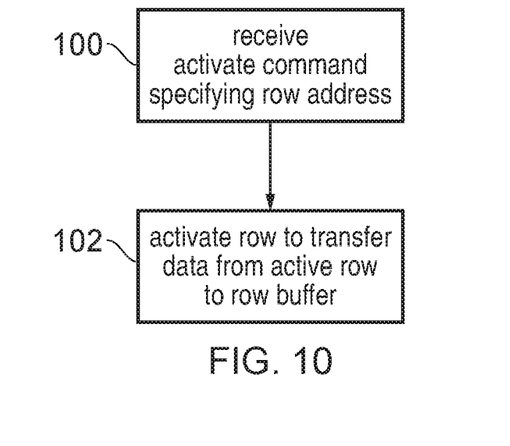
FIG. 10 is a flow diagram illustrating a method of processing an activate command.

FIG. 10 shows a method of processing an activate command. At step 100, the DRAM 64 receives an activate command specifying a row address 42 from the cache controller 62. At step 102 the control circuitry 72 controls the row decoder 40 to select the row of storage locations 34 corresponding to the row address 42 as the active row 46, and controls the row buffer 36 to capture the information stored in the respective storage locations of the active row 46.

Figure 11:
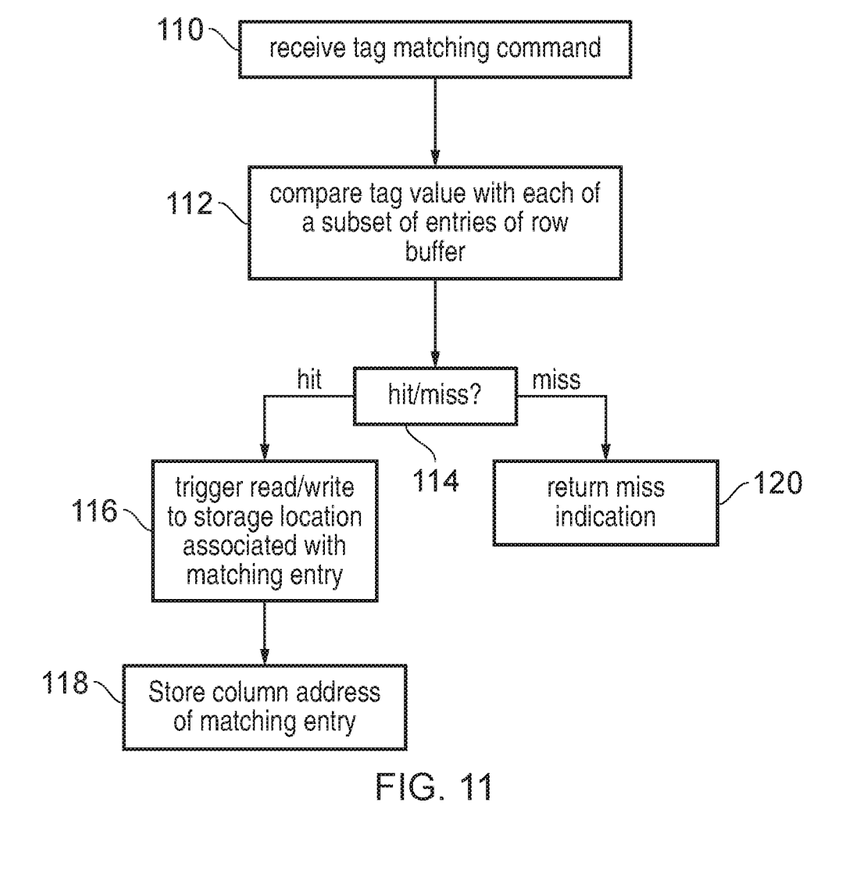
FIG. 11 is a flow diagram illustrating a method of processing tag-matching command.

FIG. 11 shows a method of processing a tag-matching command. At step 110, the DRAM 64 receive a tag-matching command specifying a row address 42 and a tag value 72 from the cache controller 62. The tag-matching command may also specify a parameter identifying whether it is a read or write command. At step 112, the control circuitry 74 controls the comparison circuitry 70 to compare the tag value 72 with each of a subset of entries 68 of the row buffer 36 (with the subset of entries being identified by the configuration storage element 76). At step 114 the control circuitry determines whether the comparison circuitry 70 has identified a hit or miss. In the case of a hit, at step 116 the control circuitry 74 triggers a read or write operation targeting the storage cell associated with the matching tag entry (which could be in the same bank or a different bank as discussed above), and the read data or write acknowledgement is returned to the cache controller 62. At step 118 the column address of the row buffer entry 68 containing the matching tag is stored to the storage element 75 for use by subsequent tag update operations. If a miss is identified at step 114, then at step 120 a miss indication is returned to the cache controller 62.

Figure 12:
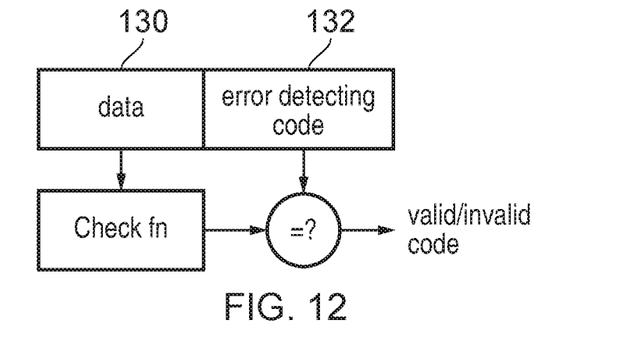
FIG. 12 illustrates the use of error detecting codes.

The miss indication returned at step 120 could be a dedicated hit/miss signal set to the opposite value to the one transmitted on a hit. However, this may require an additional output port for the DRAM unit, which can be avoided by signalling misses using the data channel instead (since the data channel is in any case unused when a cache miss occurs). In general any predetermined pattern of bits could be used to represent the cache miss, where that pattern is a pattern which could not arise for normal data accesses. One way of implementing this is to exploit error detecting codes which may be provided to protect against errors. As shown in FIG. 12, each data value 130 stored in the DRAM 64 may be associated with an error detecting code 132. On reading data from the DRAM 64, the data value 130 may be hashed using a check function 134 and the resulting hash can be compared with the error detecting code 132. If the hash matches the error detecting code 132, then the data is determined to be correct, while a mismatch may signal an error has occurred. If the error detecting code is an error correcting code, then the error may also be corrected, e.g. based on redundant information included in the error correcting code. Hence, a miss indication can be signalled to the cache controller 62 by returning a predetermined pattern of bits as the data value 130 together with an invalid error detecting code 132 which does not match the result of applying the check function 134 to the predetermined pattern of bits of the data value 130. On receiving the data in response to a cache lookup, the cache controller 62 can then identify from the combination of the predetermined pattern of data bits 130 and the invalid error detecting code 132 that a cache miss occurred, without needing a separate signal path for signalling cache misses.

Figure 13:
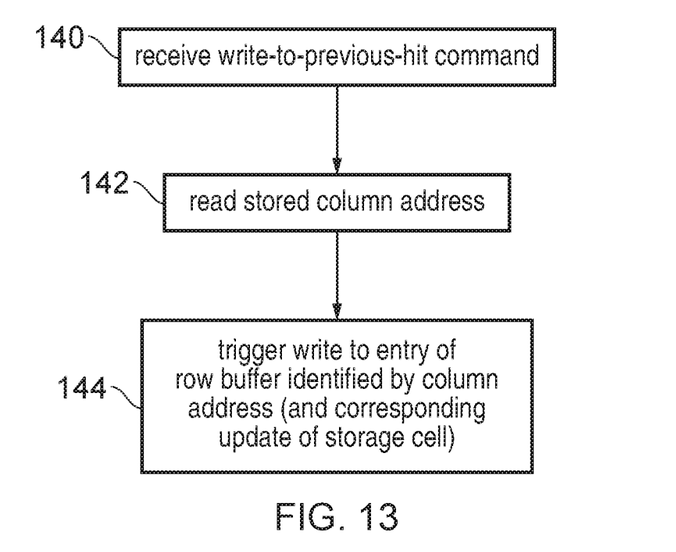
FIG. 13 is a flow diagram illustrating a method of processing a write-to-previous-hit command.

FIG. 13 shows a method of processing a write-to-previous-hit command for updating the tag value for which a hit occurred in response to a previous tag-matching command. At step 140, the DRAM unit 64 receives the write-to-previous-hit command specifying the updated tag value to be written to the DRAM. At step 142, the control circuitry 74 reads the column address from the storage element 75, which was earlier stored at step 118 of FIG. 11. At step 144, the control circuitry 74 triggers a write operation to the entry 68 of the row buffer 36 identified by the column address read at step 144, to write the updated tag value to that entry. This will also trigger a corresponding update of the corresponding storage cell in the DRAM array 32. Hence, by storing the column address of the most recently matching tag in a storage element 75, a subsequent tag update can be performed more efficiently. This is useful for caches since in some implementations every cache read or write operation may require the corresponding tag to be updated (especially in caches which use a least recently used or other victim selection algorithm for selecting which entry to evict on allocating new data based on past cache access history).

Alternatively, rather than storing the column address on a hit as at step 118, in FIG. 11 the control circuitry could instead update cache status information in a storage location selected based on which entry was the matching entry of the row buffer. Hence, as an access hits in a cache, the DRAM controller 74 also updates information which corresponds to the set and is used for the replacement policy. The replacement policy bits would be located in the same DRAM row as the data itself, so would be present in the row buffer 36. For example, if the replacement policy is pseudo-LRU (least recently used), on an access that hits, the corresponding bits of the binary tree are updated to reflect that the accessed element is in the MRU (most recently used). Hence, for this feature, the DRAM cache has some extra logic close to the DRAM row buffer which, according to the replacement policy, updates the replacement information on a cache hit.

An advantage of the approach shown in FIGS. 11 and 13 is that the control circuitry 74 in the DRAM storage does not need to be aware of which replacement policy is used, and can support two or more different policies which could be selected by the cache controller. On the other hand, by updating the cache status information directly in response to the tag-matching command, fewer commands are required on a cache hit.

Upon a miss in the cache when there are no spare invalid entries, a victim block is chosen in the relevant set, and the data is evicted from that block, and replaced with the new block that is fetched from the memory below. To speed up such evictions and replacements, a special type of read command (victim read command) can be provided which activates and reads the data based on the information of the replacement policy. For example, if the replacement policy is pseudo-LRU, the victim read command traverses the binary tree to find the LRU element. The command returns the data of the block and invalidates the block. An indication of the victim entry can be stored to the previously hit column location 75, and a command to write to the previously read location (victim) writes the newly inserted block (in the same way as for the write-to-previous-hit command of FIG. 13). Hence, with this approach, the DRAM controller 74 has an extra command that can read a column (tag and data) of the row buffer 36, where the read column is selected according to the information of the replacement policy read from the relevant subset of locations of the active row as stored in the row buffer 36.

Figure 14:
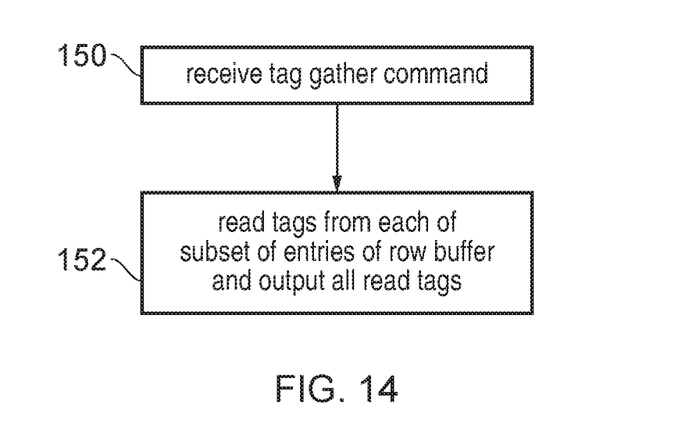
FIG. 14 is a flow diagram illustrating a method of processing a tag-gather command.

FIG. 14 shows a method of processing a tag-gather command for providing the cache controller 62 with all the tags from a given set of storage locations, which can be useful for allowing the cache controller 62 to make more informed decisions on cache allocation and eviction for example. At step 150 the DRAM unit 64 receives the tag gather command (it is not necessary to specify a row address since the command may implicitly target the active row activated in response to an earlier activate command). In response to the tag-gather command, at step 152 the control circuitry 72 controls the column multiplexer 38 to read all the tags stored in the subset of entries identified by the configuration data 76, and returns the read tags to the cache controller 62. If the combined size of the read tags is greater than the width of the data channel, then the tags can be pushed out to the cache controller 62 in multiple transfers and then assembled at the cache controller 62. The cache controller 62 can then use the read tags to perform cache management operations.

While the example discussed above relates to DRAM-based storage circuitry 64, it will be appreciated that the same technique can be used for any form of memory technology which a row buffer 36 is used to buffer information from storage locations in an active row 46.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

The invention claimed is:

1. Storage circuitry comprising:
    an array of storage locations arranged in rows and columns;
    a row buffer comprising a plurality of entries each to store information from a storage location at a corresponding column of an active row of the array;
    comparison circuitry responsive to a tag-matching command specifying a tag value to compare the tag value with information stored in each of a subset of entries of the row buffer, and to identify which of said subset of entries, if any, is a matching entry storing information matching the tag value, said subset comprising two or more entries of the row buffer; and
    control circuitry configured, in response to a hit condition when one of said subset of entries is identified as said matching entry in response to the tag-matching command, to trigger a read or write operation to read or write information stored in a target storage location selected in dependence on which entry of the row buffer is the matching entry.

2. The storage circuitry according to claim 1, wherein the comparison circuitry is configured to perform a plurality of comparisons in parallel, each comparison comparing the tag value with the information in a corresponding one of said subset of entries of the row buffer.

3. The storage circuitry according to claim 1, comprising a configuration storage element to store configuration information identifying which of the plurality of entries of the row buffer are within said subset of entries.

4. The storage circuitry according to claim 1, wherein said target storage location is another storage location in the same row of the array as the storage location corresponding to said matching entry of the row buffer.

5. The storage circuitry according to claim 1, comprising a plurality of banks, each bank comprising said array, said row buffer and said comparison circuitry;
    wherein said target storage location is a storage location in a different bank to the bank including the storage location corresponding to said matching entry of the row buffer.

6. The storage circuitry according to claim 1, wherein in response to a hit condition when one of said subset of entries is identified as said matching entry in response to the tag-matching command, the comparison circuitry is configured to store an indication of which entry of the row buffer is said matching entry to a predetermined storage element.

7. The storage circuitry according to claim 6, comprising control circuitry responsive to a write-to-previous-hit command to trigger a write operation to write information to the storage location associated with the entry of the row buffer identified by said predetermined storage element.

8. The storage circuitry according to claim 1, comprising control circuitry responsive to a hit condition when one of said subset of entries is identified as said matching entry in response to the tag-matching command, to update status information in a storage location selected based on which entry of the row buffer is said matching entry.

9. The storage circuitry according to claim 1, wherein in response to the tag-matching command, the comparison circuitry is configured to return a miss indication when none of said subset of entries of the row buffer stores information matching the tag value.

10. The storage circuitry according to claim 9, wherein each storage location is configured to store information associated with an error detecting code; and
said miss indication comprises a predetermined pattern of information associated with an invalid error detecting code.

11. The storage circuitry according to claim 1, comprising control circuitry responsive to a victim read command to read data from a victim entry of the row buffer selected in dependence on cache replacement policy information stored in the row buffer, and to invalidate data from a storage location associated with said victim entry.

12. The storage circuitry according to claim 11, wherein in response to said victim read command, the control circuitry is configured to store an indication of which entry of the row buffer is said victim entry to a predetermined storage element.

13. The storage circuitry according to claim 12, comprising control circuitry responsive to a write-to-previous-hit command to trigger a write operation to write information to the storage location associated with the entry of the row buffer identified by said predetermined storage element.

14. The storage circuitry according to claim 1, comprising control circuitry responsive to a tag-gather command to trigger a read operation to read information from each of said subset of entries of the row buffer.

15. The storage circuitry according to claim 1, wherein the storage locations comprise DRAM storage locations.

16. Storage circuitry comprising:
an array of storage locations arranged in rows and columns;
a row buffer comprising a plurality of entries each to store information from a storage location at a corresponding column of an active row of the array;
comparison circuitry responsive to a tag-matching command specifying a tag value to compare the tag value with information stored in each of a subset of entries of the row buffer, and to identify which of said subset of entries, if any, is a matching entry storing information matching the tag value, said subset comprising two or more entries of the row buffer;
a plurality of banks, each bank comprising said array, said row buffer and said comparison circuitry; and
control circuitry responsive to a write command to write a data value to a storage location in one of the plurality of banks and to write a corresponding tag value to a storage location in another of the plurality of banks.

17. An apparatus comprising:
the storage circuitry according to claim 1; and
a cache controller to control accesses to cached data stored in the storage circuitry.

18. The apparatus according to claim 17, wherein in response to a cache access request specifying a target address, one of the cache controller and the storage circuitry is configured to trigger said tag-matching command specifying a tag value determined as a function of said target address.

19. The apparatus according to claim 18, wherein in response to a hit condition when one of said subset of entries is identified as said matching entry in response to the tag-matching command, the storage circuitry is configured to output to said cache controller at least one of:
a data value corresponding to a target storage location other than the storage location associated with the matching entry; and
information for identifying which storage location of the storage circuitry is said target storage location.

20. A method for accessing information from storage circuitry comprising an array of storage locations arranged in rows and columns; the method comprising;
transferring information from storage locations in an active row of the array to a row buffer comprising a plurality of entries, each entry storing information from a storage location at a corresponding column of the active row;
in response to a tag-matching command specifying a tag value, comparing the tag value with information stored in each of a subset of entries of the row buffer, and identifying which of said subset of entries, if any, is a matching entry storing information matching the tag value, said subset comprising two or more entries of the row buffer; and
in response to a hit condition when one of said subset of entries is identified as said matching entry in response to the tag-matching command, triggering a read or write operation to read or write information stored in a target storage location selected in dependence on which entry of the row buffer is the matching entry.

* * * * *